US006955971B2

(12) United States Patent
Ghyselen et al.

(10) Patent No.: US 6,955,971 B2
(45) Date of Patent: Oct. 18, 2005

(54) SEMICONDUCTOR STRUCTURE AND METHODS FOR FABRICATING SAME

(75) Inventors: Bruno Ghyselen, Seyssinet (FR); Oliver Rayssac, Grenoble (FR); Cécile Aulnette, Grenoble (FR); Carlos Mazuré, St. Nazaire les Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/704,703

(22) Filed: Nov. 12, 2003

(65) Prior Publication Data

US 2004/0150067 A1 Aug. 5, 2004

Related U.S. Application Data

(60) Provisional application No. 60/472,436, filed on May 22, 2003.

(30) Foreign Application Priority Data

Nov. 12, 2002 (FR) .............................. 02 14123

(51) Int. Cl.$^7$ .......................................... H01L 21/762
(52) U.S. Cl. ...................... 438/406; 438/118; 438/455; 438/459; 438/692; 438/959; 438/977; 438/981
(58) Field of Search ................................ 438/118, 406, 438/455, 456, 459, 692, 959, 977, 981, FOR 395, FOR 403, FOR 485

(56) References Cited

U.S. PATENT DOCUMENTS

| 5,091,330 | A | | 2/1992 | Cambou et al. ............... 437/62 |
|---|---|---|---|---|
| 5,238,865 | A | | 8/1993 | Eguchi ........................ 437/62 |
| 5,369,050 | A | | 11/1994 | Kawai ......................... 437/62 |
| 5,436,173 | A | * | 7/1995 | Houston ...................... 438/155 |
| 5,548,149 | A | | 8/1996 | Joyner ......................... 257/347 |
| 5,950,094 | A | | 9/1999 | Lin et al. ..................... 438/409 |
| 6,091,109 | A | * | 7/2000 | Hasegawa .................... 257/339 |
| 6,150,220 | A | * | 11/2000 | Huh et al. .................... 438/275 |
| 6,204,546 | B1 | | 3/2001 | Roitman et al. .............. 257/506 |
| 6,333,532 | B1 | | 12/2001 | Davari et al. ................ 257/301 |
| 6,362,059 | B2 | * | 3/2002 | Fukasaku et al. ............ 438/289 |
| 6,503,811 | B1 | | 1/2003 | Ohkubo ....................... 438/406 |
| 6,583,011 | B1 | * | 6/2003 | Xia et al. ..................... 438/275 |
| 2001/0018274 | A1 | * | 8/2001 | Sugizaki et al. ............. 438/773 |
| 2002/0047159 | A1 | | 4/2002 | Yamazaki et al. ........... 257/347 |
| 2002/0157790 | A1 | * | 10/2002 | Abe et al. .................... 156/334 |

FOREIGN PATENT DOCUMENTS

| EP | 0 687 002 A2 | 12/1995 |
|---|---|---|
| EP | 0 701 286 A1 | 3/1996 |
| EP | 1 193 754 A2 | 4/2002 |
| EP | 1 246 248 A2 | 10/2002 |
| FR | 2 823 596 | 10/2002 |
| JP | 05 190657 | 7/1993 |
| JP | 11145481 | 5/1999 |
| JP | 2000349148 | 12/2000 |
| WO | WO 00/48245 | 8/2000 |
| WO | WO 01 54174 A | 7/2001 |
| WO | WO 01/61743 A1 | 8/2001 |

* cited by examiner

*Primary Examiner*—George Fourson
*Assistant Examiner*—Joannie Adelle Garcia
(74) *Attorney, Agent, or Firm*—Winston & Strawn LLP

(57) ABSTRACT

A semiconductor structure and methods for fabricating are disclosed. In an implementation, a method of fabricating a semiconductor structure includes forming a first semiconductor material substrate with a first dielectric area having a first thickness and a second dielectric area having a second thickness, bonding the first substrate to a second semiconductor substrate, and thinning at least one of the first and second substrates. The invention also pertains to a semiconductor structure. The structure includes a semiconductor substrate having a surface layer of semiconductor material, a first dielectric layer of a first dielectric material buried under the surface layer, and a second dielectric layer buried under the surface layer. In an embodiment, the thickness of the first dielectric layer is different than the thickness of the second dielectric layer.

39 Claims, 6 Drawing Sheets

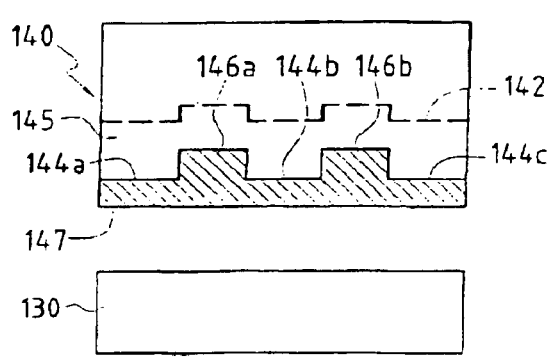
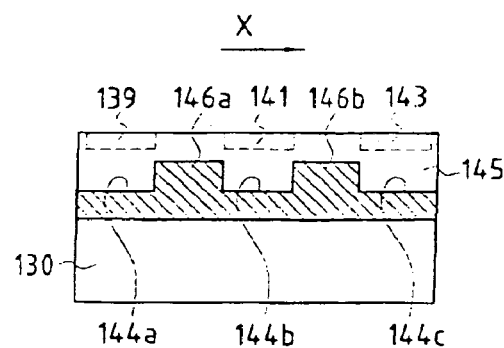
FIG.4A　　　　　FIG.4B
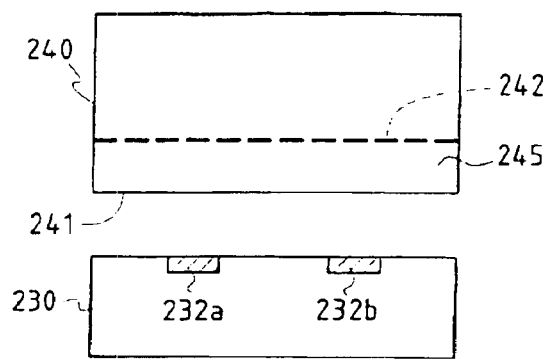
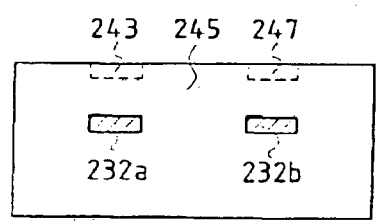
FIG.5A　　　　　FIG.5B
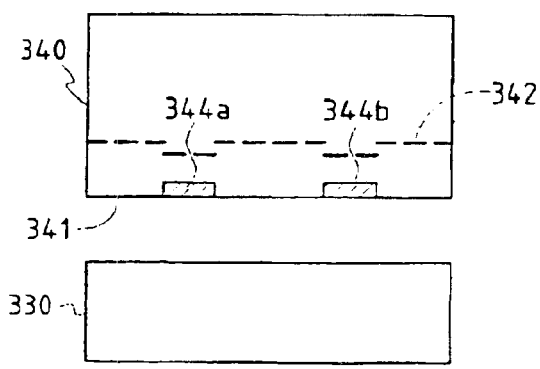
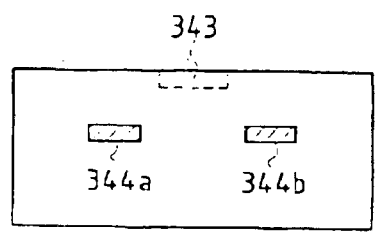
FIG.6A　　　　　FIG.6B

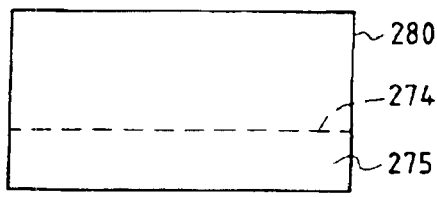
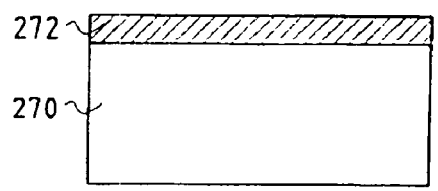
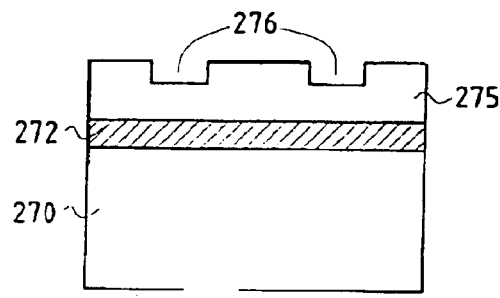
FIG.11A　　　　　　　　　　FIG.11B
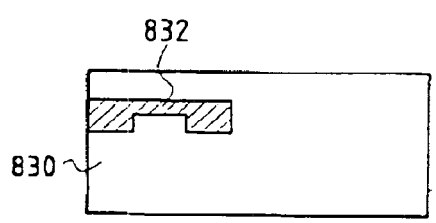
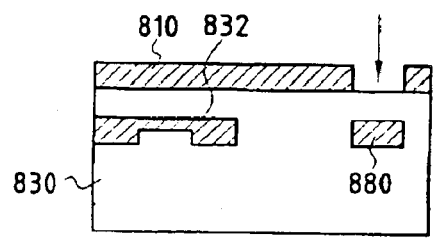
FIG.12A　　　　　　　　　　FIG.12B

SEMICONDUCTOR STRUCTURE AND METHODS FOR FABRICATING SAME

This application claims the benefit of U.S. provisional application No. 60/472,436 filed May 22, 2003.

BACKGROUND

The invention generally pertains to semiconductor structures that include a semiconductor substrate having a surface layer of semiconductor material, a first dielectric layer of a first dielectric material buried under the surface layer and a second dielectric layer buried under the surface layer. Methods are disclosed for manufacturing such semiconductor components or elements, in particular silicon on insulator (SOI) components or elements.

A SOI structure typically includes a silicon layer containing components. Beneath the components is a buried silicon oxide layer which provides insulation against stray currents and charges originating from ionized particles. The silicon oxide layer also provides good isolation of adjacent components formed in the same silicon layer, and in particular significantly reduces the stray capacitance between adjacent components. It rests on a silicon substrate which provides a mechanical support.

The surface silicon layer typically has a thickness in the range of about 10 nanometers (nm) to 1000 nm, for example. The oxide layer typically has a thickness on the order of a few hundred nanometers (for example 400 nm) or more.

The thickness of an SOI structure can vary, and in particular the thickness of the silicon layer may vary. Silicon layers of different thickness may correspond to fully depleted (FD) SOI components, which have a surface silicon layer from approximately 20 nm to approximately 40 nm thick, and partially depleted (PD) SOI components, in which the thickness of the surface silicon layer is greater than approximately 70 nm.

Silicon oxide layers of different thickness provide different degrees of isolation, different leakage currents, different voltage ratings, and different equivalent capacitances. The values of each of these parameters can be chosen by the designer. A particular thickness may suit different applications, for example, applications concerning logic circuits and other digital circuits and power applications. The PD SOI technology is preferred for some applications or functions, and the FD SOI technology or the bulk (silicon substrate) technology is preferred for other applications.

A need exists for integrating components and structures on the same substrate, having bulk (silicon substrate) areas, SOI areas and/or FD SOI and PD SOI areas. Moreover, there may be different thickness requirements for the surface silicon layers and/or different thickness requirements for the buried oxide layers. Such structures are needed in the field of microsystems that integrate sensors or accelerometers, for example, and in the field of "one chip systems" which integrate a plurality of functions on the same chip.

The great majority of SOI components are currently homogeneous. But techniques for producing SOI components with alternating bulk and SOI areas are known in the art.

FIGS. 1A and 1B are diagrams that illustrate a conventional first technique for producing SOI components or elements. A known technique is first used to produce an SOI component 2 onto which an etching mask 4 is deposited (see FIG. 1A). An etching step is then used to produce alternating bulk areas 6, 8 and SOI areas 10, 12, 14 (see FIG. 1B). This technique cannot be used at present to produce SOI areas having different thickness silicon layers and/or different thickness oxide layers on the same substrate. Nor can it be used at present to produce components integrating FD SOI areas and PD SOI areas on the same substrate, or to provide electrical continuity between bulk areas and the surface silicon layer in the SOI areas. Lastly, the structure obtained is not planar.

FIG. 2 is a diagram of a structure obtained by using another known technique, the separation by implanted oxygen (SIMOX) technique, for producing SOI components. Areas 16, 18 of silicon dioxide are obtained by implanting O++ ions through a mask 20. A structure including a thin surface film of monocrystalline silicon isolated from the mass of the substrate is produced. However, the layer of oxide produced in this manner is again a uniform layer. This technique cannot be used to produce layers having a different thickness on the same substrate.

The SIMOX technique also suffers from other problems. First, non-homogeneous stresses and other stresses occur in the substrate, as confirmed in the paper by S. Bagchi et al. published in the proceedings of the IEEE International SOI Conference, October 1999, p. 121–122, "Defect Analysis of Patterned SOI Material". In particular, slight swellings or differences in flatness have been observed on the surface above the implanted areas 16, 18.

A wafer bonding technique is also known in the art, but cannot at present be used to produce SOI areas with different thickness requirements.

It would be desirable to have a technique for producing, on the same substrate, a semiconductor component, element or structure having two or more semiconductor on insulator areas with a different thickness of the surface semiconductor material layer and/or a different thickness of the dielectric material layer. It would also be useful to have a technique for producing, on the same substrate, a semiconductor component or element, or a semiconductor structure integrating bulk (semiconductor material substrate) areas and semiconductor on insulator areas and/or semiconductor material surface layer having a thickness that differs from one area to another, and/or a dielectric thickness that differs from one area to another.

It would also be desirable to be able to produce, on the same substrate, an SOI component, element or structure having two or more SOI areas having a different thickness of the surface silicon layer, and/or a different thickness of the oxide layer. In addition, it would be advantageous to produce, on the same substrate, a semiconductor component or element or an SOI semiconductor structure integrating bulk (silicon substrate) areas, SOI areas and/or FD SOI and PD SOI areas with a surface silicon thickness that differs from one area to another, and/or a dielectric thickness that differs from one area to another. A component, element or structure obtained by such a method should preferably be planar and provide electrical continuity between different areas of different thickness, and in particular between the different surface semiconductor material or silicon areas or layers. Stresses and dislocations must also be avoided or reduced.

It would be advantageous to be able to produce semiconductor components having buried dielectric elements individually connected by buried conductive elements. The dielectric elements may be buried layers of varying thickness, and may be situated under surface semiconductor layers that are of varying thickness. It would also be desirable to develop new techniques for producing such semiconductor substrates.

SUMMARY OF THE INVENTION

Presented are a semiconductor structure and methods for fabricating the same. In a first implementation, a method of fabricating a semiconductor structure includes forming a first semiconductor material substrate with a first dielectric area having a first thickness and a second dielectric area having a second thickness. The technique includes bonding the first substrate to a second semiconductor material substrate, and thinning at least one of the first and second substrates.

An advantageous variation of the invention includes forming a third dielectric area having a third thickness in the first substrate. The third thickness may be different from at least one of the first thickness and the second thickness, and the third dielectric area may be different from the material of at least one of the first dielectric area or the second dielectric area. Further, first and second dielectric areas may be formed in the second substrate, the second dielectric area may have a thickness that is different from that of the first dielectric area, and the first and second dielectric areas may consist of two different materials. Thinning of the substrate may include at least one of polishing or etching, and a finishing step including at least one of localized thinning or localized thickening of at least one of the first and second substrates may be used. Yet further, the method may include forming at least one of a conductive or metal portion or a doped area to provide a conductive connection between a plurality of dielectric areas.

Another embodiment according to the invention pertains to a method of fabricating a semiconductor structure. This variation includes forming a dielectric area in a first semiconductor material substrate, bonding the first substrate to a second semiconductor material substrate, and thinning at least one of the first and second substrates. A surface layer of semiconductor material is formed on the dielectric area, and a first area of the surface layer has a first thickness and a second area of the surface layer has a second thickness that is different from the first thickness.

In yet another advantageous implementation, a method of fabricating a semiconductor structure includes forming a first dielectric area of a first dielectric material having a first thickness in a semiconductor substrate, and forming a second dielectric area of a second dielectric material having a second thickness in the semiconductor substrate by ion implantation. The second thickness may be different from the first thickness.

In this implementation, ion implantation may be used to form the first dielectric area, and different energy levels or doses may be used to implant ions in the first dielectric material and the second dielectric material.

The invention also pertains to a semiconductor structure. The structure includes a semiconductor substrate having a surface layer of semiconductor material, a first dielectric layer of a first dielectric material buried under the surface layer, and a second dielectric layer buried under the surface layer. The thickness of the first dielectric layer is different than the thickness of the second dielectric layer.

In an advantageous embodiment, the thickness of a first surface semiconductor layer on top of the first dielectric layer is different than the thickness of a second surface semiconductor layer on top of the second dielectric layer. A third dielectric layer may be buried under the surface layer, and the thickness of the semiconductor layer on top of the third dielectric layer may be non-zero and different from at least one of the thicknesses of a first semiconductor layer on top of the first dielectric layer and of a second surface semiconductor layer on top of the second dielectric layer. At least one of the dielectric layers may have an area of at least one square micrometer, or an area of at most one square micrometer. The semiconductor area portion on top of at least one of the first, second or third dielectric areas may be of the FD SOI type, and the semiconductor area portion on top of another of the areas may be of the PD SOI type.

An advantageous structure includes a first electronic component formed in the semiconductor layer on top of the first dielectric layer and a second electronic component formed in the semiconductor layer on top of the second dielectric layer. At least one of the first and the second electronic components may be a transistor, and a first portion of the transistor may be produced in the semiconductor layer on top of the first dielectric layer and a second portion of the same transistor could be produced on top of the second dielectric layer.

BRIEF DESCRIPTION OF THE FIGURES

FIGS. 3A–7B show different embodiments according to the invention;

FIGS. 11A and 11B show another embodiment of the invention having a varying thickness surface silicon layer;

FIGS. 12A and 12B show another embodiment of a semiconductor structure according to the invention.

DETAILED DESCRIPTION OF THE PREFERRED EMBODIMENTS

Figure 1A:
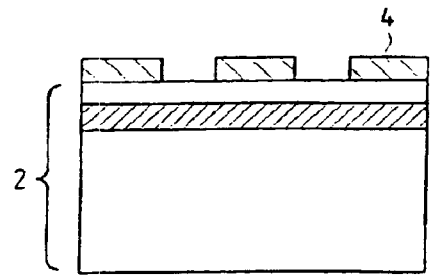
FIGS. 1A, 1B and 2 are diagrams of SOI structures formed by using prior art methods.
Figure 1B:
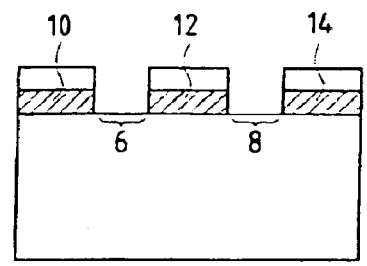

A method is provided for producing a semiconductor structure. The technique includes forming a first semiconductor material substrate with a first dielectric area having a first thickness, and a second dielectric area having a second thickness which can be different from the first thickness. The substrates are bonded, and then one or both substrates are thinned. When bonded, the two substrates form a single or monolithic component or substrate having a surface semiconductor material layer that provides electrical continuity. Bonding of the substrates avoids the dislocations and stresses observed with techniques known in the art, such as the SIMOX technique, and the swelling and differences in flatness observed on the surface above implanted areas.

The single component may include dielectric areas alternating with bulk or semiconductor substrate areas. Two dielectric areas formed in the same component, each having a different thickness, wherein each thickness may be uniform, can suit different requirements. Moreover, the first and second dielectric areas may consist of different dielectric materials. A third dielectric area may be formed in the first substrate having a third thickness which may be different from the first thickness and/or the second thickness.

One embodiment may include forming in the second substrate a first dielectric area which may be of uniform thickness. It may further include forming in the second substrate a second dielectric area, which may have a non-zero thickness, which may be uniform and that may be different from the thickness of the first dielectric area of the second substrate. If the semiconductor material is silicon, an SOI structure is obtained. A metal or conductive land or portion or a doped area may also be produced, establishing a connection between two or more dielectric areas.

The invention also provides a method of producing a semiconductor structure. A first semiconductor material substrate can be formed having a dielectric material dielectric area. The first substrate may be bonded to a second semiconductor material substrate, and either or both substrates can be thinned. The result is a surface layer of semiconductor material on the dielectric material layer, a first area of the surface layer having a first thickness and a second area of the surface layer having a second thickness different from the first thickness. The resulting surface semiconductor layer structure has a varying thickness. The substrate may be thinned by forming a weakened plane or layer, or by implanting atoms or ions in the first or second substrate. The implanted ions may be hydrogen ions, but other substances may be used, including co-implanting hydrogen and helium (H/He) atoms, or by forming a layer of porous silicon in the case of silicon. The substrate may then be thinned by polishing or etching. Thinning the substrate may be followed by a finishing step such as a localized or overall step of thinning by polishing, etching or sacrificial oxidation. Alternately, a step of localized or overall thickening of the silicon film, for example, by epitaxial growth may be used.

The invention further provides a method of producing a semiconductor structure. The method includes forming in a semiconductor substrate, for example by ion implantation or by a deposition and/or oxidation technique, a first dielectric area of a first dielectric material having a first thickness. The technique also includes a second step of forming in the same substrate, by ion implantation, a second dielectric area of a second dielectric material having a second thickness. The second thickness may be different from the first thickness. This process again produces dielectric areas in the same substrate which may have different thicknesses, but without fracturing a substrate and without bonding two substrates if both steps use ion implantation.

In all embodiments, the first and second dielectric areas may consist of different dielectric materials. The different dielectric areas may therefore be made from one or more dielectric materials such as, for example, silicon dioxide ($SiO_2$), silicon nitride ($Si_3N_4$), diamond, sapphire, hafnium oxide ($HfO_2$), zirconium oxide ($ZrO_2$), alumina ($Al_2O_3$), lanthanum oxide ($La_2O_3$), or yttrium oxide ($Y_2O_3$).

The invention further provides a semiconductor structure. The semiconductor substrate includes a first area in a semiconductor material surface layer under which is formed a buried first dielectric layer of a first dielectric material, and a second area in the semiconductor material surface layer under which is formed a buried second dielectric layer. The thickness of the first and of the second semiconductor surface layers may be non-zero and different from each other. The thicknesses of the first and second dielectric layers may also be non-zero and different from each other.

This semiconductor structure may include a third area of the semiconductor material surface layer under which is formed a buried third dielectric layer referred. The thickness of the third area of the semiconductor layer may be different from the thicknesses of the first and second areas of the semiconductor layer. The thickness of the third dielectric layer may be different from the thicknesses of the first and second dielectric layers. One or more of the dielectric areas may have a size of at least one square micrometer or less than one square micrometer. One of the first, second, and, where applicable, third areas of the semiconductor layer may be an FD SOI layer and another of these areas may be a PD SOI layer. One of the first, second, and where applicable, third areas of the semiconductor layer may have a thickness from 10 nm to 70 nm and another of these semiconductor material surface layers may have a thickness from 50 nm to 250 nm. A semiconductor component having the above structure is also provided. A first electronic component formed in the semiconductor layer is formed on top of the first dielectric layer, and a second electronic component is formed in the semiconductor layer on top of the second dielectric layer, or where applicable on top of the third dielectric layer. The first and/or second electronic components may be a transistor, for example, an MOS transistor. In an embodiment of such a semiconductor element, a first portion of a transistor is produced in the first area of the semiconductor layer and a second portion of the same transistor is produced in the second area of the semiconductor layer.

Figure 3A:
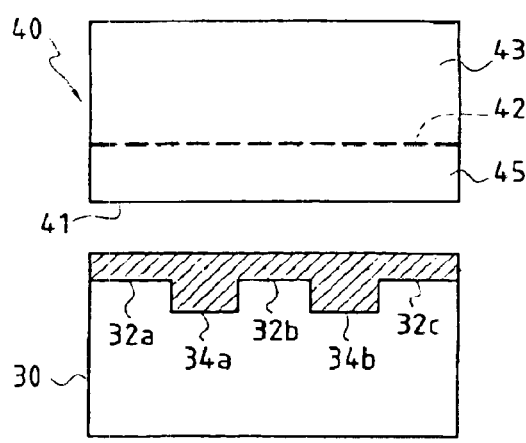
Figure 3B:
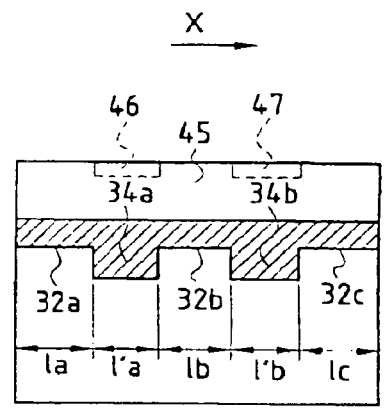

FIGS. 3A and 3B are diagrams of a structure formed by using a first embodiment of the present method. In a first semiconductor (for example silicon) substrate 30, dielectric (for example silicon oxide $SiO_2$) areas or layers 32a, 32b, 32c, 34a, 34b are formed having different thickness parameters, typically on the order of a few hundred nm, for example from about 100 nm to 500 nm. The thickness of each layer can be as high as a few tens of thousands of nm, and thus may be from 100 nm to 5000 nm, for example. Different techniques can be used to produce these dielectric areas, such as the methods described below with reference to FIG. 8A and subsequent figures.

In a second semiconductor substrate 40, a thin layer 42 substantially parallel to a surface 41 of the substrate 40 is formed by implanting atoms or ions. This process forms a weakened or fracture layer or plane that delimits the substrate 40 into a lower, thin film region 45, and an upper region 43. Hydrogen is usually implanted, but other substances can be used, or atoms of hydrogen and helium (H/He) can be co-implanted.

The two substrates 30 and 40 prepared in the above manner are then assembled by a wafer bonding technique or by adherent contact, for example by molecular adhesion or by bonding. Such techniques are described in Q. Y. Tong and U. Gosele "Semiconductor Wafer Bonding" (Science and Technology), Wiley Interscience Publications.

A portion of the substrate 40 is then detached by causing a fracture along the weakened plane 42. An example of this technique is described in the paper by A. J. Auberton-Herve et al. "Why can Smart-Cut change the future of microelectronics ?" in International Journal of High Speed Electronics and Systems, Vol. 10, No. 1 (2000), p. 131–146.

FIG. 3B shows a semiconductor component, element or structure formed in this manner. The semiconductor component includes a thin, non-zero thickness first dielectric area, which can be of uniform width or extension (in an extension direction arrow "x"), and a second dielectric area, thicker than the first, whose thickness can be uniform, and of non-zero width or extension (in the direction of arrow "x"). Alternately, there may be alternating (or any other form of juxtaposition) thin, non-zero thickness dielectric areas 32a, 32b, 32c, each of non-zero width or extension 1a, 1b, 1c (in the direction of arrow "x"), and a plurality of dielectric areas 34a, 34b thicker than the areas 32a, 32b, 32c, each having a non-zero width or extension 1'a, 1'b (in the direction of arrow "x").

One or more semiconductor substrate (bulk) areas can also be formed within such an alternating structure. A planar hybrid substrate is produced. Diverse electronic components can then be formed in the semiconductor surface layer 45.

In another embodiment, shown in FIGS. 4A and 4B, a first substrate is a semiconductor material substrate 130 and the second semiconductor substrate 140 is obtained by forming a juxtaposition (or alternating or any other distribution) of dielectric (for example SiO$_2$) areas 144a, 144b, 144c having a first thickness and silicon oxide areas 146a, 146b having a second thickness greater than the first thickness. For example, the dielectric areas may be from 10 nm to 100 nm, from 100 nm to 500 nm or from 100 nm to 5000 nm thick. Ion implantation then forms a weakened plane or layer 142 similar to the plane or layer 42 described above. The plane or layer 142 delimits a surface semiconductor film 145.

Because the H+ ions encounter different thicknesses of dielectric or silicon oxide on their trajectory, the layer 142 is not necessarily situated at a uniform thickness relative to the surface 147 of the substrate 140, as shown in FIG. 4A. In some cases, the beam of ions ignores the variations in the thickness of the dielectric or silicon oxide.

The two substrates 130 and 140 prepared in this manner may then be assembled using one of the techniques mentioned above (wafer bonding, bonding or adherent contact, for example, by molecular adhesion). A portion of the substrate 140 is then eliminated or detached by a treatment that causes a fracture along the weakened area or plane 142, as already described with reference to FIG. 3B, leaving the layer or film 145 on the buried dielectric or oxide layer.

After fracturing the substrate in which the weakened layer is formed (the portion situated on the opposite side of the assembly interface of the two substrates), a finishing step may follow, for example a thinning step to flatten out irregularities caused by the possibly varying depth of the layer 142. For example, polishing may be used, in particular mechanical/chemical polishing, or etching, or sacrificial oxidation. It is also possible to locally or globally thicken the silicon film, for example, by epitaxial growth.

Referring to FIG. 4B, a semiconductor component or element or a substrate is thus formed that has a thin, non-zero thickness dielectric layer (in this example a layer of oxide SiO$_2$), whose thickness can be uniform, of non-zero width or extension (in an extension direction illustrated by the arrow x), and a thicker dielectric area (in this example an area of oxide SiO$_2$), whose thickness can be uniform, and of non-zero width or extension (in the direction of arrow x). Alternately, there may be alternating (or any other form of juxtaposition) thin, non-zero thickness dielectric layers (for example SiO$_2$ layers) 144a, 144b, 144c, whose thickness can be uniform, each of non-zero width or extension (in the direction of arrow x), and thicker dielectric layers (in this example SiO$_2$ layers) 146a, 146b, whose thickness can be uniform, and each of non-zero width or extension (in the direction of arrow x). One or more silicon or semiconductor substrate (bulk) areas can also be formed within the above kind of alternation.

Thus a planar hybrid substrate is again obtained. The substrate can also have thin semiconductor or silicon surface areas and thicker semiconductor or silicon surface areas. Consequently, diverse electronic components can be produced on the same substrate in the silicon or semiconductor surface layer 145, and in particular components using different technologies, for example FD SOI components and PD SOI components.

In a further embodiment, shown in FIGS. 5A and 5B, a first substrate is an unprocessed semiconductor (for example silicon) substrate 230 in which dielectric (for example SiO$_2$) areas 232a, 232b are produced alongside unprocessed silicon areas. These dielectric areas may have thicknesses, for example, from 10 nm to 100 nm, from 100 nm to 500 nm or from 100 nm to 5000 nm. A second substrate 240 is obtained by implanting atoms or ions, for example hydrogen ions, to form a layer 242 similar to the layers 42 and 142 described above. The two substrates 230 and 240 prepared in this way are then assembled using one of the techniques mentioned above (wafer bonding, bonding or adherent contact, for example, by molecular adhesion). The portion of the substrate 240 on the side opposite the face 241 is then eliminated or detached, as described above in connection with FIG. 3B. A hybrid planar semiconductor structure or semiconductor component or element (see FIG. 5B) is formed having alternating (or any other form of juxtaposition or distribution) dielectric areas 232a, 232b (in this example oxide SiO$_2$ areas), which can have different thicknesses, and unprocessed silicon or semiconductor areas. Diverse electronic components can then be produced in the semiconductor or silicon surface layer 245, in particular in the portion of the layer on top of the dielectric or silicon oxide areas.

A further embodiment is shown in FIGS. 6A and 6B. A first substrate is an unprocessed silicon or semiconductor substrate 330 and the second substrate 340 is obtained by forming juxtaposed dielectric or silicon oxide areas 344a, 344b and unprocessed silicon or semiconductor areas. Ions are then implanted, for example hydrogen ions, to form a layer 342 similar to the layer 42 described above. As explained above in connection with FIG. 4a, because the ions encounter different thicknesses of dielectric or silicon oxide on their trajectory, the layer 342 may not be necessarily situated at an uniform thickness relative to the surface 341 of the substrate 340. The two substrates 340 and 330 prepared in this way are then assembled using one of the techniques mentioned above(wafer bonding, bonding or adherent contact, for example by molecular adhesion). A portion of the substrate 340 is then eliminated, as already described above in connection with FIG. 3B. A finishing thinning or thickening step, as described above in connection with FIG. 4B, may be used to flatten out any irregularities caused by the varying depth of the layer 342.

The result is the formation of a hybrid planar semiconductor structure or semiconductor element, substrate or component (FIG. 6B) that includes alternating (or any other form of juxtaposition or distribution) dielectric areas 344a, 344b (in this example oxide SiO$_2$ areas). These dielectric areas can have different thicknesses, and unprocessed silicon or semiconductor areas. Diverse electronic components can then be produced in the silicon or semiconductor surface layer, in particular in the portion of the layer on top of the dielectric or silicon oxide areas 344a, 344b.

Any combination of the techniques described above can be used. In particular, any combination of juxtaposed dielectric or silicon dioxide areas with different thicknesses and/or silicon or semiconductor surface areas with different thicknesses and/or dielectric or silicon dioxide areas and silicon or semiconductor substrate areas can be produced in the same substrate or component. In this way it is possible to produce a continuous dielectric or silicon dioxide layer having alternating or a succession of thinner areas, possibly of uniform thickness, and thicker areas, also possibly of uniform thickness.

Figure 7A:
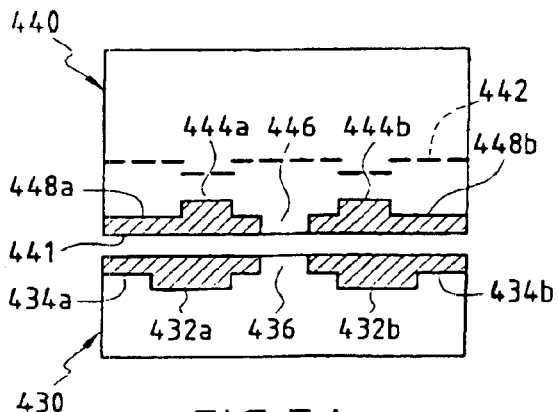
Figure 7B:
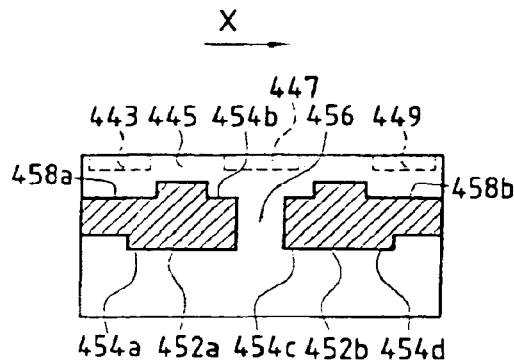

Accordingly, in the example shown in FIGS. 7A and 7B, a first substrate 430 is an unprocessed silicon or semiconductor substrate in which is formed juxtaposed (or alternating or any other form of distribution) dielectric or silicon oxide areas 432a, 432b having a particular first thickness, thinner dielectric or silicon oxide areas 434a, 434b, and silicon or semiconductor substrate areas 436. FIG. 7B shows only one such silicon area 456, but the same substrate can include several such areas. The oxide areas can be from 10 nm to 100 nm, 100 nm to 500 nm or 10 nm or 100 nm to 5000 nm thick, for example. The second substrate 440 is obtained by forming juxtaposed dielectric or silicon oxide areas 444a, 444b having a particular first thickness, thinner dielectric or silicon oxide areas 448a, 448b, and silicon or semiconductor substrate 446 areas. The thicknesses of the oxide areas or layers can be in the ranges just indicated. Implanting hydrogen (or other) ions then forms a layer 442 similar to the layer 42 described above. Because the H+ ions encounter different thicknesses of dielectric or silicon oxide on their trajectory, the layer 442 is not necessarily situated at a uniform thickness relative to the surface 441 of the substrate 440, as already indicated above in connection with FIG. 4A.

The two substrates 430 and 440 prepared in this way are then assembled by one of the techniques mentioned above (wafer bonding, bonding or adherent contact, for example by molecular adhesion). A portion of the substrate 440 is then eliminated or detached, as already described above with reference to FIG. 3B. Fracturing the substrate in which the weakened layer is formed (the portion on the opposite side of the assembly interface of the two substrates), can be followed by a finishing step, as described above in connection with FIG. 4B, for example.

The result is a hybrid planar semiconductor element or substrate as shown in FIG. 7B. The hybrid planar element includes two or more dielectric or oxide areas 452a, 452b having two different thicknesses, each of which can be uniform, and possibly a silicon or semiconductor substrate area 456, wherein these two or three areas each have a non-zero width or extension (in an extension direction of arrow x). Alternately, the hybrid element may include alternating (or any other form of juxtaposition) dielectric or oxide areas 452a, 452b, 454a, 454b, 454c, 454d, 458a, 458b, and possibly silicon or semiconductor substrate areas 45. The dielectric or oxide areas 452a, 452b may have a first thickness different from a second thickness of the dielectric or oxide areas 454a, 454b, 454c, 454d, which two thicknesses can be uniform and both different from a third thickness of the areas 458a, 458b, each of these areas having a non-zero width or extension (in the direction of arrow x). In addition, in the same substrate, alternating or juxtaposed different thicknesses of the silicon or semiconductor surface layer may be obtained.

Instead, it is equally possible to produce a dielectric or oxide layer of single or uniform thickness in one of the substrates. For example, the substrate 430, wherein the substrate 440 is prepared as indicated above (with one or more dielectric or oxide layers with different thicknesses), and then assembling the two substrates to produce a structure (not shown) also with different dielectric or oxide thicknesses, or a continuous dielectric or oxide layer having different thicknesses, which can be uniform.

Diverse electronic components can then be produced in the silicon or semiconductor surface layer 445, in particular in the portion of the layer on top of the dielectric or silicon oxide areas. Diverse components can also be produced in the different thickness areas of the surface layer 445, thus forming FD SOI and PD SOI components on the same substrate.

Figure 8A:
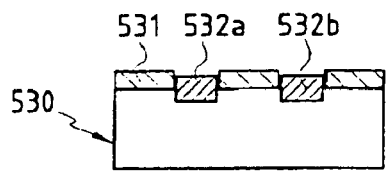
FIGS. 8A–8E and 9A–9D show different methods that can be used in the context of the invention.
Figure 8B:
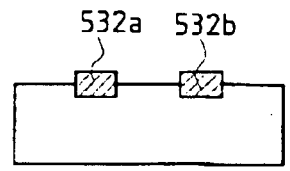
Figure 8D:
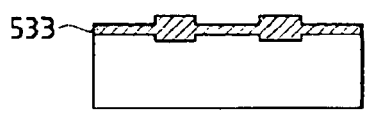
Figure 8C:
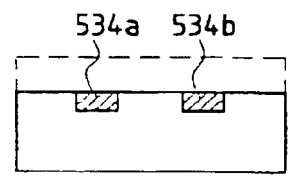
Figure 8E:
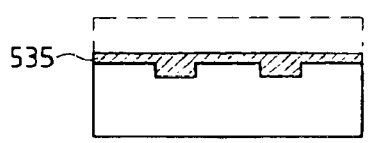

FIGS. 8A–8E illustrate a substrate used in the context of the present method and which can have different thicknesses of silicon dioxide. In FIG. 8A, silicon dioxide areas 532a, 532b which are a few hundred nm thick, for example 400 nm thick, are produced on a substrate 530 by LOCOS (locally oxidized silicon) growth through a mask 531, for example a Si$_3$N$_4$ mask. These areas can take the form of patches strips or more complex shapes. In FIG. 8B, the mask is removed leaving the silicon oxide areas 532a, 532b. Note that, at this stage, the substrate is no longer flat. A leveling step may then be used, for example mechanical/chemical polishing (FIG. 8C), which yields a substrate with silicon dioxide areas 534a, 534b juxtaposed to the silicon of the substrate itself. The substrate may be same as that shown in FIG. 5A or 6A, for example. In a variant shown in FIG. 8D, a layer 533 of surface oxidation of the substrate is produced from the FIG. 8B structure and the resulting structure is then leveled as shown in FIG. 8E, for example by mechanical/chemical polishing, to leave a surface oxidation layer 535. A layer with a thickness of a few hundred nm (for example 300 nm) can be removed in this manner, leaving a juxtaposition of silicon dioxide areas with different thicknesses. This type of substrate is shown in FIGS. 3A and 4A. It is also possible to level the surface first (see FIG. 8C), followed by surface oxidation.

Figure 9A:
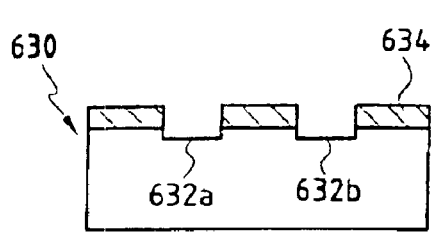

FIGS. 9A–9D show another method that can be used in the context of the present invention. In FIG. 9A, trenches 632a, 632b are etched, for example by dry etching through a mask 634, into a silicon substrate 630 to a depth of a few tens of nm, for example 100 nm. The mask is then removed (see FIG. 9B) after which the surface of the substrate is thermally oxidized or a silicon dioxide layer is deposited, forming a silicon dioxide layer 636 having a thickness of a few hundred nm, for example 400 nm. It is then possible to level the surface by using, for example, mechanical/chemical polishing (see FIG. 9C), which yields a substrate having silicon oxide areas 634a, 634b juxtaposed to the silicon of the substrate itself. For example, such a substrate is shown in FIG. 5A or 6A.

Figure 9B:
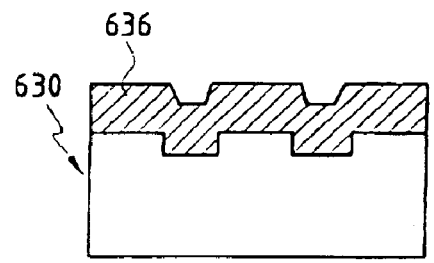
Figure 9D:
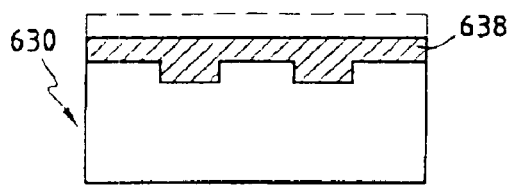
Figure 9C:
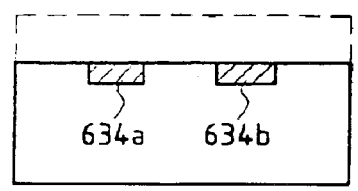

In a variant shown in FIG. 9D, the structure shown in FIG. 9B is flattened, but less so than in FIG. 9C. A silicon dioxide layer 638 is left having a thickness of a few hundred nm, for example, approximately 100 nm. This produces a juxtaposition of silicon dioxide areas with different thicknesses on the surface of the silicon substrate 630. This type of substrate is also shown in FIGS. 3A and 4A.

Note the following difference between the two variants shown in FIGS. 9C and 9D. In the second case of FIG. 9D, polishing stops in the oxide (SiO$_2$) layer. In the first case, the silicon is bared and can serve as a stop layer. Selective polishing methods can then be used.

Figure 2:
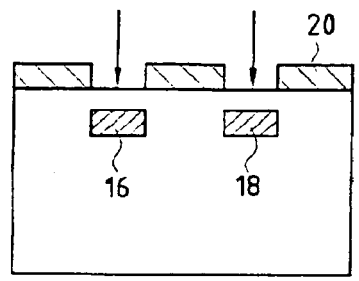

Methods other than those described above with reference to FIGS. 8A to 9C can be used. In particular, any method using a combination of techniques for depositing oxide or surface oxidation, leveling or etching, yielding a structure such as that shown in FIG. 8C, 8E, 9C or 9D, regardless of the order in which these operations are conducted. These processes produce uniform thickness silicon dioxide areas such as the areas 534a, 534b, 634a, 634b or continuous layers of oxide with varying thickness; the thickness is locally uniform except at points or in areas of discontinuity between two different thickness oxide portions. Note that the areas 532a, 532b, 534a, 534b, 634a, 634b can be any shape, for example in the form of circular patches, or extend linearly in a direction perpendicular to the plane of FIGS. 8B, 8C and 9C. The same considerations apply to the silicon oxide layers, such as the layers 533, 535, 636, 638. Generally speaking, the structures shown in FIGS. 3A–7B can also be considered to extend in a direction perpendicular to the plane of the substrate. All the embodiments described above prevent or limit the dislocations and stresses encountered when using the prior art technique described above with reference to FIG. 2.

Figure 10A:
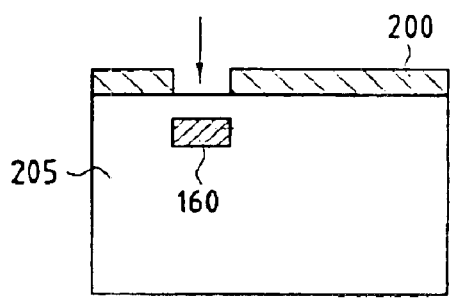
FIGS. 10A and 10B show another embodiment of the invention without bonding of substrates.
Figure 10B:
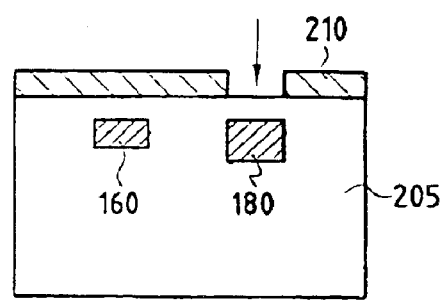

FIGS. 10A and 10B show another embodiment of a component or a structure according to the invention. This embodiment uses the SIMOX technique based on implanting oxygen ions. It also produces a planar hybrid structure or component, although it does not avoid the problems of stresses and dislocations resulting from the use of the technique described above with regard to FIG. 2.

Referring to FIG. 10A, in a first step a mask 200 is used to form a dielectric area in a semiconductor (for example silicon) substrate 205, for example a silicon dioxide area 160, having a first thickness (typically a few hundred nanometers, for example 100 nm or 200 nm). This is achieved by implanting oxygen ions O++ at a first energy and at a first dose. FIG. 10B illustrates the use of a second mask 210 to select another area of the substrate and to implant therein oxygen O++ ions at a second energy and a second dose that may be different from the first energy and/or the first dose used in the first step. This produces in the substrate 205 a silicon dioxide area 180 having a second thickness different from the first thickness (also a few hundred nanometers, for example 400 nm or 500 nm). The method illustrated by FIGS. 10A and 10B does not use bonding or assembly of substrates, but nevertheless produces a hybrid planar structure or component.

As already indicated above, using the SIMOX technique results in the appearance of non-homogeneous stresses and stresses in the substrate. Also, swelling or differences in flatness may be observed at the surface above the implanted areas. The buried oxide or dielectric layers produced by the SIMOX technique are of poorer quality and less dense than those obtained using deposition and oxidation techniques. These buried areas also have breakdown voltages somewhat different from areas produced by the other techniques. Overall, components obtained by the SIMOX technique are relatively easy to distinguish from those obtained by the other techniques.

The invention can also produce structures having varying surface layer thicknesses. For example, a local thinning step can be applied to the substrate or to the silicon or semiconductor surface layer 45 (see FIG. 3), 145 (see FIG. 4B) or 245 (see FIG. 5B), or to the layer or the substrate of FIG. 6B, or in FIG. 7B as indicated by the dotted line outline in those Figures. In particular, a local thinning step (for example by etching or sacrificial oxidation) can produce a silicon or semiconductor surface layer of varying thickness, with areas 46, 47, 139, 141, 143, 243, 247, 343, 443, 447, 449 having a surface Si thickness less than the thickness of other surface Si or semiconductor areas, or with certain areas of the surface Si or semiconductor layer having a first thickness alternating with a second thickness different from the first thickness. After localized thinning, the silicon surface layer still provides electrical continuity between the different areas.

In a variant, the thickness of the dielectric or oxide layer is uniform and the thickness of the silicon or semiconductor surface layer varies. Accordingly, in FIG. 11A, a dielectric or silicon dioxide layer 272 with a uniform thickness is produced in a substrate 270 and the substrate 280 is prepared like the substrate 40 from FIG. 3A, for example, the weakened layer or plane 274 is similar to the layer 42 in FIG. 3A. The two substrates 270, 280 produced in this way are then assembled, again using wafer bonding, bonding or an adhesion contact technique. A portion of the substrate 280 is then eliminated by treatment causing a fracture along the weakened plane 274. Localized thinning using an etching or sacrificial oxidation method, for example, or localized leveling, produces a silicon or semiconductor surface layer of varying thickness, with a first thickness and a second thickness in the areas 276. The silicon or semiconductor surface layer again provides electrical continuity between the different areas after local thinning. In this manner varying thicknesses can be obtained for the semiconductor or silicon layer, for example from 10 nm to 50 nm or 70 nm in one area, and from 50 nm, 70 nm or 80 nm to 250 nm in another area.

FIGS. 12A and 12B show another embodiment of a component according to the invention. This embodiment uses the surface oxidation or deposition technique described above with reference to FIGS. 8A to 9C and the SIMOX technique described above with reference to FIGS. 10A and 10B. For example, as shown in FIG. 12A, a first dielectric area 832, which can include sub areas with different thicknesses, is produced in a semiconductor substrate 830, for example as described with reference to FIGS. 7A and 7B. As shown in FIG. 12B, a mask 810 is then used to produce, by means of ion implantation, in particular by implanting oxygen ions in the case of silicon dioxide, a dielectric area 880. The dielectric area 880 can have the same thickness as one of the sub areas of the area 832 or a different thickness.

Figure 13A:
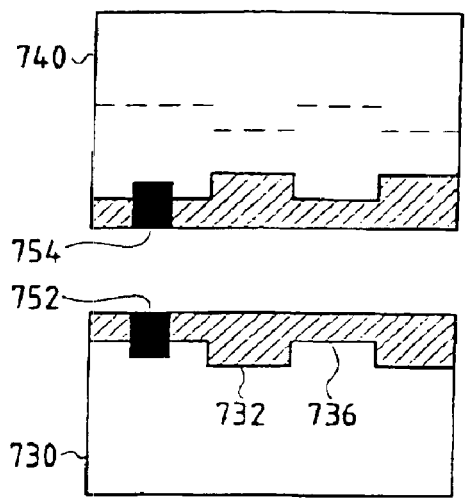
FIGS. 13A and 13B show another aspect of the invention with a conductive land formed in the dielectric layers.
Figure 13B:
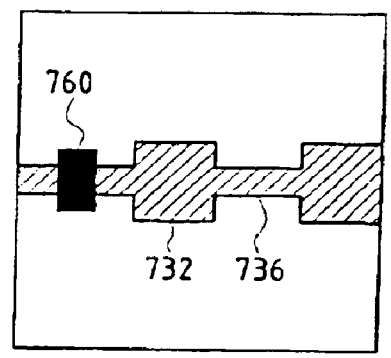

The invention also provides a method and a component shown in FIGS. 13A and 13B. The method is similar to the methods already described above, for example with reference to FIGS. 7A and 7B, with alternating or juxtaposed silicon oxide areas 732, 736 with different thicknesses. Also included is the formation by etching and deposition of conductive or metal lands 752, 754 which, after a connection is established between the two substrates 730, 740, produce a conductive or metal member or land 760 establishing a conductive connection in and through the dielectric areas. The conductive material used can be $WSi_2$, for example. In a variant, conductive lands can be produced by doping dielectric or semiconductor areas of the substrates 730, 740. Metal or conductive lands can be formed by any of the methods already described above, in particular in connection with FIGS. 3A–9C.

Whatever production method is envisaged, a hybrid planar and for example SOI structure, component or substrate is obtained. The component or substrate may include, on the same substrate, buried dielectric or silicon dioxide areas having different thicknesses and/or silicon or semiconductor surface areas having different thicknesses. The semiconductor surface layer is continuous between the different areas, providing electrical continuity between the different areas.

FD SOI areas can be juxtaposed with PD SOI areas and substrate (bulk) areas or areas having a semiconductor or silicon surface layer from 10 nm to 50 nm or 70 nm thick, for example, and areas having a semiconductor or silicon surface layer from 50 nm, 70 nm or 80 nm to 250 nm thick, for example. The components, in particular the electronic components, for example transistors, produced in the substrate can then employ different technologies.

Figure 14:
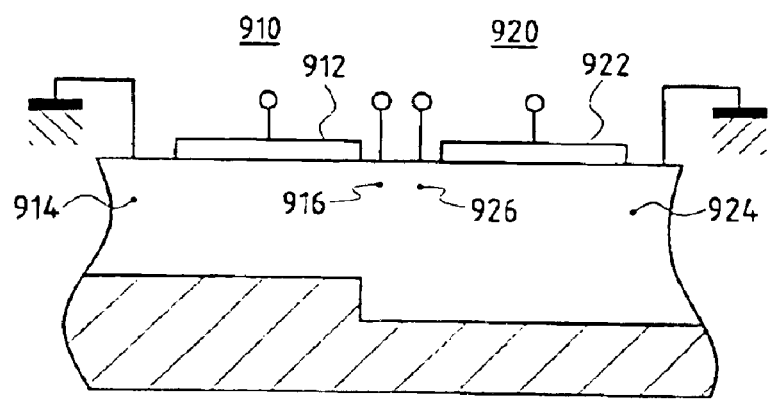
FIG. 14 shows the fabrication of two transistors in different areas of an SOI substrate according to the invention.

FIG. 14 shows a portion of a substrate of the type obtained as described above with reference to FIG. 4B or FIG. 7B. Two MOS transistors 910, 920 each having a gate 912, 922, a drain 916, 926 and a source 914, 924 are produced. The thicker or thinner silicon areas under these transistors produce a fully depleted (FD) SOI component 910 and a partially depleted (PD) SOI component 920. It is also possible to have an FD area under one portion of a transistor, for example, under its gate and its drain, and a PD area under another portion of the same transistor, for example under its source. The different areas obtained, for example the FD or PD areas, can have a size of 1 square millimeter (mm$^2$) or more, so that sub micron technology is not necessary for forming the buried oxide layers. Sub micron technologies can be used to produce smaller areas, less than 1 mm$^2$, for example of the order of a few square micrometers ($\mu$m$^2$) or a few tens of $\mu$m$^2$. For example, it is possible to produce specific areas under the drain and/or source and/or gate areas of a transistor, for example a specific area under the gate 912 of the MOS transistor 910 in FIG. 12, the areas situated under the drain and the source of the same transistor being of a different kind because of a different oxide thickness and/or a different silicon layer thickness.

The invention has been described with the material SiO$_2$ as the insulator in an SOI structure. It nevertheless applies to other dielectric materials, such as Si$_3$N$_4$, diamond and sapphire, for example. It also applies to any material with a high coefficient K, such as those described in MRS Bulletin, March 2002, Vol. 27, No. 3, "Alternative Gate Dielectrics for Microelectronics". Such materials include, for example, hafnium oxide (HfO$_2$), zirconium oxide (ZrO$_2$), alumina (Al$_2$O$_3$) and yttrium oxide (Y$_2$O$_3$), and are preferably used to produce thin layers, i.e. layers with a thickness of a few tens of nm, for example from 10 nm to 50 nm.

It is equally possible to produce one or more dielectric areas of a first dielectric material and one or more dielectric areas of a second dielectric material different from the first material. Thus, the areas 534*a* and 534*b* in FIG. 8C can be of a different kind of material from each other, and likewise the areas 634*a* and 634*b* in FIG. 9C or the areas 160 and 180 in FIG. 10C may be different. From this starting point, all combinations are possible using one of the methods described above.

All the above methods, except for the method described with reference to FIGS. 8A to 8E, can then be used for dielectrics that are not oxides (for example diamond). Deposition techniques are then used. A weakened plane can be formed by methods other than ion implantation. Thus is it also possible to produce a layer of porous silicon, as described in the paper by K. Sataguchi et al. "ELTRAN® by Splitting Porous Si Layers", Proceedings of the 9th International Symposium on Silicon-on-Insulator Tech. And Device, 99–3, The Electrochemical Society, Seattle, p. 117–121 (1999).

Polishing or etching techniques can be used for thinning the substrates 40, 140, 240, 340, 440, 280, 740 without using ion implantation and without creating a weakened plane. Finally, the above description relates to the use of silicon as the basic semiconductor material. Other semiconductor materials (for example SiGe, SiC, AsGa, InP, GaN) can be used instead of silicon, the invention applying equally to forming semiconductor on insulator structures (possibly with conductive lands as in FIG. 13B).

What is claimed is:

1. A method of fabricating a semiconductor structure comprising:
   forming a first semiconductor material substrate with a first dielectric area having a first thickness and a second dielectric area having a second thickness, with the first dielectric area being separated from the second dielectric area by a semiconductor area;
   bonding the first substrate to a second semiconductor material substrate; and
   thinning at least one of the first and second semiconductor material substrates to form the semiconductor structure, wherein the two substrates are bonded together by molecular adhesion.

2. The method according to claim 1 wherein the first thickness and the second thickness are different.

3. The method according to claim 1 wherein the first thickness and the second thickness are essentially equal.

4. The method according to claim 1 wherein the first dielectric area and the second dielectric area are of two different dielectric materials.

5. The method according to claim 1 which further comprises forming a third dielectric area having a third thickness in the first substrate.

6. The method according to claim 5 wherein the third thickness is different from at least one of the first thickness or the second thickness.

7. The method according to claim 5 wherein the material of the third dielectric area is different from that of at least one of the first dielectric area or the second dielectric area.

8. The method according to claim 1 which further comprises forming a first dielectric area in the second substrate.

9. The method according to claim 8 which further comprises forming a second dielectric area in the second substrate.

10. The method according to claim 9 wherein the second dielectric area of the second substrate has a thickness that is different from that of the first dielectric area of the second substrate.

11. The method according to claim 9 wherein the first and second dielectric areas of the second substrate are of two different materials.

12. The method according to claim 1 which further comprises forming a weakened area in at least one of the first or second substrates.

13. The method according to claim 12 wherein the weakened area is formed by at least one of a layer of porous silicon or by implanting ions in at least one of the respective first or second substrates.

14. The method according to claim 13 wherein the implanted ions are at least one of hydrogen ions or a mixture of hydrogen ions and helium ions.

15. The method according to claim 1 wherein thinning comprises at least one of polishing or etching.

16. The method according to claim 1 wherein the dielectric areas are formed by at least one of deposition or surface oxidation.

17. The method according to claim 1 wherein the dielectric areas are made of at least one of silicon nitride, diamond, sapphire, silicon dioxide, hafnium oxide, zirconium oxide, alumina, lanthanum oxide or yttrium oxide.

18. The method according to claim 1 further comprising a finishing step including at least one of local thinning or local thickening of at least one of the first or second substrates.

19. The method according to claim 1 further comprising forming at least one of a conductive or metal portion or a doped area to provide a conductive connection between a plurality of dielectric areas.

20. The method according to claim 1 wherein a surface layer of semiconductor material is formed over the dielectric area, and wherein a first area of the surface layer has a first thickness and a second area of the surface layer has a second thickness that is different from the first thickness.

21. The method according to claim 20 wherein the two substrates are bonded together by molecular adhesion.

22. The method according to claim 20 which further comprises forming a weakened area in at least one of the first or second substrates.

23. The method according to claim 22 wherein the weakened area is formed by at least one of using a layer of porous silicon or by implanting ions in at least one of the respective first or second substrates.

24. The method according to claim 23 wherein the implanted ions are at least one of hydrogen ions or a mixture of hydrogen ions and helium ions.

25. The method according to claim 20 wherein thinning comprises at least one of polishing or etching.

26. The method according to claim 20 wherein the dielectric areas are formed by at least one of deposition or surface oxidation.

27. The method according to claim 20 wherein the dielectric area is made of at least one of silicon nitride, diamond, sapphire, silicon dioxide, hafnium oxide, zirconium oxide, alumina, lanthanum oxide or yttrium oxide.

28. The method according to claim 20 comprising a finishing step including at least one of localized thinning or localized thickening of at least one of the first and second substrates.

29. The method according to claim 20 further comprising forming at least one of a conductive or metal portion or a doped area to provide a conductive connection between a plurality of dielectric areas.

30. The method according to claim 1 which further comprises forming a second dielectric area of a second dielectric material having a second thickness in the second semiconductor material substrate by ion implantation.

31. The method according to claim 30 wherein the second thickness is different from the first thickness.

32. The method according to claim 30 wherein the first dielectric area is formed using ion implantation.

33. The method according to claim 32 further comprises using different energy levels or doses to implant ions in the first dielectric material and the second dielectric material.

34. The method according to claim 30 wherein the dielectric material of the second dielectric area is chosen from silicon dioxide or silicon nitride.

35. The method according to claim 30 wherein forming the first dielectric area includes at least one of deposition or surface oxidation.

36. The method according to claim 35 wherein the dielectric material of the first dielectric area is silicon dioxide, silicon nitride, diamond, sapphire, hafnium oxide, zirconium oxide, alumina, lanthanum oxide or yttrium oxide.

37. The method according to claim 30 wherein the semiconductor material is silicon, silicon carbide, gallium arsenide, gallium nitride, SiGe or indium phosphide.

38. A method according to claim 30 wherein the semiconductor structure is an SOI structure.

39. A method according to claim 30 further comprising thinning a local surface layer of semiconductor material.

* * * * *

UNITED STATES PATENT AND TRADEMARK OFFICE
CERTIFICATE OF CORRECTION

PATENT NO. : 6,955,971 B2  
APPLICATION NO. : 10/704703  
DATED : October 18, 2005  
INVENTOR(S) : Ghyselen et al.

It is certified that error appears in the above-identified patent and that said Letters Patent is hereby corrected as shown below:

<u>Title Page</u>:
Item (75) Inventors, change "Oliver" to -- Olivier --.

<u>Column 15</u>:
Line 17, after "The method according to claim 20" insert --further --.

Signed and Sealed this

Third Day of July, 2007

JON W. DUDAS
*Director of the United States Patent and Trademark Office*